(12) United States Patent
Zhang

(10) Patent No.: US 11,005,020 B2
(45) Date of Patent: May 11, 2021

(54) DISPLAY PANEL AND FABRICATING METHOD THEREOF

(71) Applicant: Shanghai Tianma AM-OLED Co., Ltd., Shanghai (CN)

(72) Inventor: Peng Zhang, Shanghai (CN)

(73) Assignee: Shanghai Tianma AM-OLED Co., Ltd., Shanghai (CN)

(*) Notice: Subject to any disclaimer, the term of this patent is extended or adjusted under 35 U.S.C. 154(b) by 0 days.

(21) Appl. No.: 16/730,602

(22) Filed: Dec. 30, 2019

(65) Prior Publication Data

US 2021/0066559 A1 Mar. 4, 2021

(30) Foreign Application Priority Data

Aug. 30, 2019 (CN) .......................... 201910815735.2

(51) Int. Cl.
*H01L 33/62* (2010.01)
*H01L 25/075* (2006.01)
*H01L 33/00* (2010.01)

(52) U.S. Cl.
CPC .......... *H01L 33/62* (2013.01); *H01L 25/0753* (2013.01); *H01L 33/0095* (2013.01); *H01L 2933/0066* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0223091 | A1* | 11/2004 | Chen | G02F 1/13458 349/43 |
| 2012/0139124 | A1* | 6/2012 | Oganesian | H01L 25/50 257/774 |
| 2016/0380058 | A1* | 12/2016 | Basker | H01L 21/32105 257/401 |
| 2017/0097548 | A1* | 4/2017 | Aoyama | G02F 1/134309 |

FOREIGN PATENT DOCUMENTS

| CN | 100382253 C | 4/2008 |
|---|---|---|
| CN | 104570423 A | 4/2015 |

* cited by examiner

*Primary Examiner* — Ratisha Mehta
(74) *Attorney, Agent, or Firm* — Christensen O'Connor Johnson Kindness PLLC

(57) ABSTRACT

The present disclosure provides a display panel and a fabricating method thereof. The display panel includes a substrate and a plurality of mutually insulated binding pads disposed on the substrate. Each binding pad includes an upper surface, a lower surface and a side surface. The upper surface and the lower surface are both parallel to a plane of the substrate, the side surface is located between the upper surface and the lower surface, and the side surface connects the upper surface with the lower surface. A first insulating layer is disposed on the side surface of the binding pad, the first insulating layer is in contact with the side surface of the binding pad and is made of an inorganic material. With such a configuration, the side surface of the binding pad will not be damaged by an etching process subsequent to fabrication of the binding pads.

11 Claims, 6 Drawing Sheets

DISPLAY PANEL AND FABRICATING METHOD THEREOF

CROSS-REFERENCE TO RELATED APPLICATIONS

The present application claims priority to Chinese Patent Application No. 201910815735.2, filed on Aug. 30, 2019, the content of which is incorporated herein by reference in its entirety.

TECHNICAL FIELD

The present disclosure relates to the field of display, and in particular, to a display panel and a fabricating method thereof.

BACKGROUND

A display panel includes a display region for displaying an image and a non-display region surrounding the display region. The non-display region is mainly used for routing and placement of a binding pad. The binding pad is connected to a signal line of the display region for transmitting a signal of a chip or a flexible printed circuit board to the signal line, so the binding pad needs to be exposed to be bound to the chip or the flexible printed circuit board. After fabricating of the binding pad is completed, other subsequent processes of the display panel may damage the binding pad. Since the binding pad is formed by a metal material, there is also a risk in a wet etching process for subsequent preparation of other conductive structures that part of the binding pad is etched. A common practice to solve the above problem is to provide a protective structure at an edge of an upper surface of the binding pad, so as to try to prevent an etching solution from contacting the binding pad too much.

However, with the development of display technologies, a high screen ratio has become a new pursuit of consumers and display panel manufacturers. Especially in a field of smart wears, such as watches/bracelets, demands for "a narrow neck" design are getting higher and higher, that is, a narrower binding area is better. However, providing the protective structure on the edge of the upper surface of the binding pad will occupy part of the binding area of the binding pad, and if the binding pad is made wider, a width of the binding area will be increased so as to affect the screen ratio, or a distance between the binding pads will be reduced, which results in signal interference between the signal lines in the binding area.

SUMMARY

In view of this, embodiments of the present disclosure provide a display panel, and a fabricating method thereof, to solve the above problems.

In a first aspect, a representative embodiment of the present application provides a display panel including: a substrate; a plurality of mutually insulated binding pads disposed on the substrate, wherein each binding pad of the plurality of mutually insulated binding pads includes an upper surface, a lower surface and a side surface, the upper surface and the lower surface are both parallel to a plane of the substrate, the side surface is located between the upper surface and the lower surface, and the side surface connects the upper surface with the lower surface; and a first insulating layer disposed on the side surface, wherein the first insulating layer is in contact with the side surface of the binding pad, and the first insulating layer is made of an inorganic material In a second aspect, a representative embodiment of the present disclosure provides a fabricating method of a display panel, the fabricating method including: forming a plurality of mutually insulated binding pads on a substrate, wherein each binding pad includes an upper surface, a lower surface and a side surface, the upper surface and the lower surface are both parallel to a plane of the substrate, the side surface is located between the upper surface and the lower surface, and the side surface connects the upper surface with the lower surface; and forming a first insulating layer on the side surface, the first insulating layer being in contact with the side surface, and the first insulating layer being made of an inorganic material.

BRIEF DESCRIPTION OF DRAWINGS

In order to more clearly illustrate technical solutions of embodiments of the present disclosure, the accompanying drawings used in the embodiments are briefly described below. The drawings described below illustrate representative embodiments of the present disclosure.

DESCRIPTION OF EMBODIMENTS

In order to better understand technical solutions of the present disclosure, the embodiments of the present disclosure are described below in details with reference to the drawings.

It should be clear that the described embodiments are representative embodiments of the present disclosure rather than all of the embodiments.

The terms used in the embodiments of the present disclosure are for the purpose of describing particular embodiments and not intended to limit the present disclosure. The singular form expressions "a", "an", "the" and "said" used in the embodiments and appended claims of the present disclosure are also intended to include a plural form, unless otherwise noted in the context.

It should be understood that the term "and/or" as used herein is an association describing the associated objects, indicating that there may be three relationships. For example, A and/or B may indicate three cases: only A exists; A and B exist concurrently; only B exists. In addition, a character "/" herein generally indicates that the contextual objects are in an "or" relationship.

In the description of the present specification, it is to be understood that terms "substantially", "approximate", "about", "round", "generally", "basically", and the like, as used in the claims and embodiments of the present disclosure, mean that it can be generally agreed within a reasonable process operation range or a tolerance range, but not an exact value.

It should be understood that although the terms first, second, third, etc. may be used to describe the display regions in the embodiments of the present disclosure, these display regions should not be limited to these terms. These terms are used to distinguish the display regions from each other. For example, without departing from the scope of the embodiments of the present disclosure, a first display region may also be referred to as a second display region, and similarly, the second display region may also be referred to as the first display region.

Figure 1:
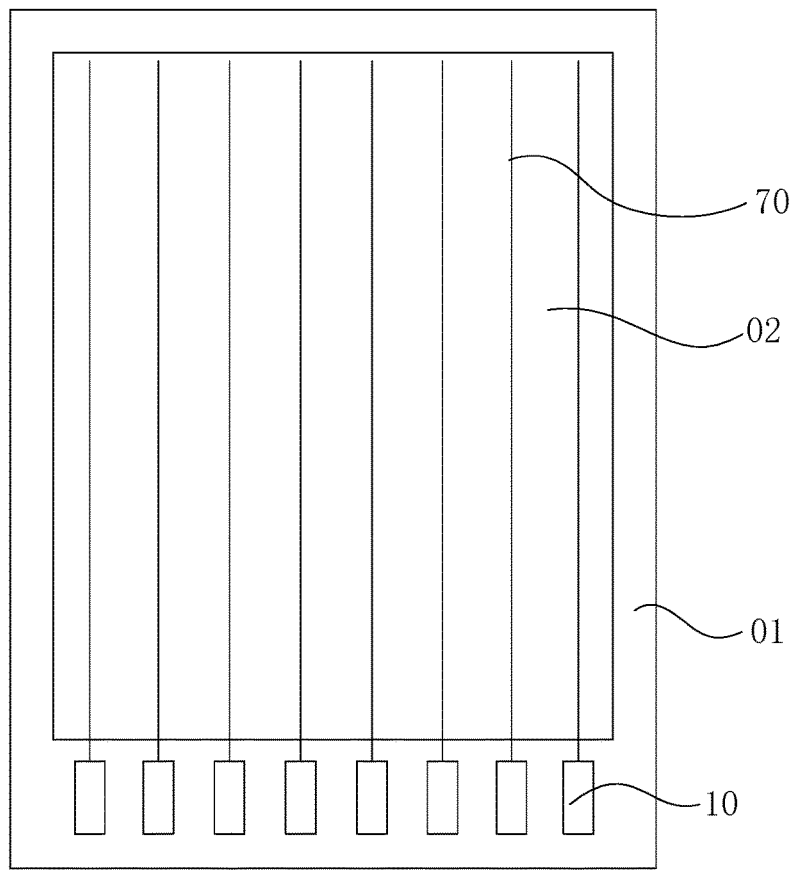
FIG. 1 is a plan diagram of a display panel provided by a representative embodiment of the present disclosure.
Figure 2:
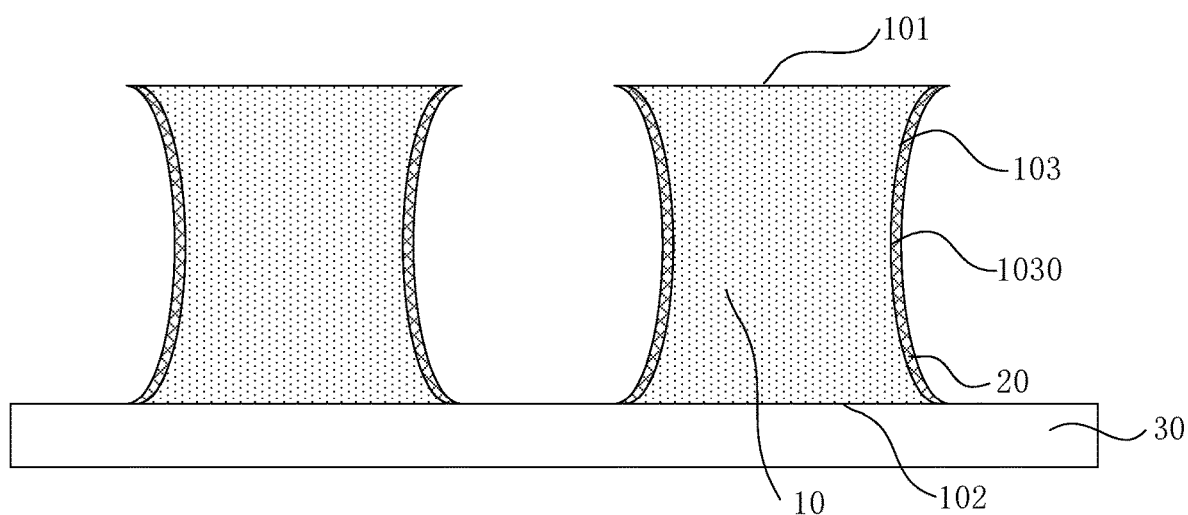
FIG. 2 is a partial cross-sectional diagram of a binding area of a display panel provided by a representative embodiment of the present disclosure.

Embodiments of the present disclosure provides a display panel. FIG. 1 is a plan diagram of a display panel provided by a representative embodiment of the present disclosure, and FIG. 2 is a partial cross-sectional diagram of a binding area of a display panel provided by an embodiment of the present disclosure. The display panel includes a substrate 30 and a plurality of mutually insulated binding pads 10 disposed on the substrate 30. Each binding pad 10 includes an upper surface 101, a lower surface 102 and a side surface 103; both the upper surface 101 and the lower surface 102 are parallel to a plane of the substrate 30; and the upper surface 101 is a surface facing away from the substrate 30, and the lower surface 102 is a surface close to the substrate 30. The side surface 103 is located between the upper surface 101 and the lower surface 102, and the side surface 103 connects the upper surface 101 with the lower surface 102. A first insulating layer 20 is disposed on the side surface 103 of the binding pad 10. The first insulating layer 20 is in contact with the side surface 103 of the binding pad 10, and the first insulating layer 20 is made of an inorganic material.

With continued reference to FIG. 1, the display panel provided by the embodiments of the present disclosure can be divided into a display region 02 and a non-display region 01 surrounding the display region 02. Signal lines 70 and light-emitting units (not shown in the drawing) are disposed in the display region 02, and the binding pads 10 are disposed in the non-display region 01. At least part of the binding pads 10 disposed in the non-display region 01 is electrically connected to the signal lines 70 disposed in the display region 02 and can transmit electrical signals for the signal lines 70, such as a display signal, a touch detection signal, and the like. In an embodiment, the binding pads 10 can be bound to a printed circuit board or a flexible circuit board, for receiving corresponding electrical signals.

It should be noted that the part of the binding pads 10 can be electrically connected to the signal lines 70, while another part of the binding pads 10 may not be electrically connected to the signal lines, for example, used as binding counterpoints or the like. In addition, FIG. 1 and FIG. 2 are representative and should not be used to limit a specific display panel structure to which the embodiments of the present disclosure are applied.

Since the display unit in the display region 02 includes a relatively large number of conductive structures, it is also necessary to fabricate other conductive structures after fabrication of the binding pads 10 are completed. For example, the display panel can be a liquid crystal display panel, so after the fabrication of the binding pads 10 are completed, it is also necessary to fabricate a pixel electrode, or it is also necessary to fabricate a common electrode/touch electrode, a touch trace, etc. For example, the display panel can also be an organic light-emitting display panel, so after the fabrication of the binding pads 10 are completed, it is also necessary to fabricate a cathode, an anode, etc. It should be noted that a specific display type of the display panel is not limited in the embodiments of the present disclosure. Since the side surface 103 of each binding pad 10 is provided with the first insulating layer, then after the fabrication of the binding pads 10 are completed, the side surface 103 of the binding pad 10 will not be damaged when other conductive film layers are subsequently etched.

Figure 3:
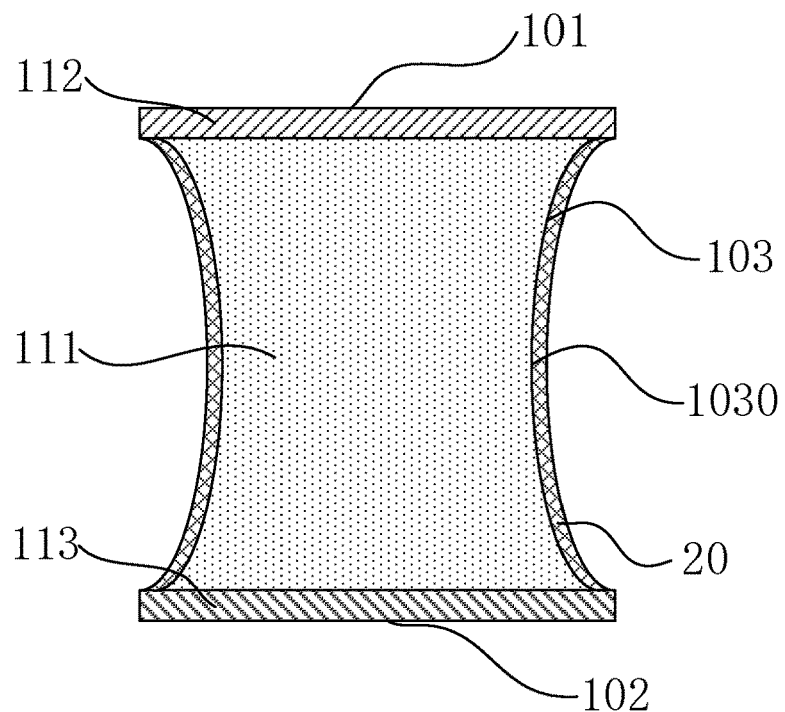
FIG. 3 is a structural diagram of a binding pad provided by a representative embodiment of the present disclosure.
Figure 4:
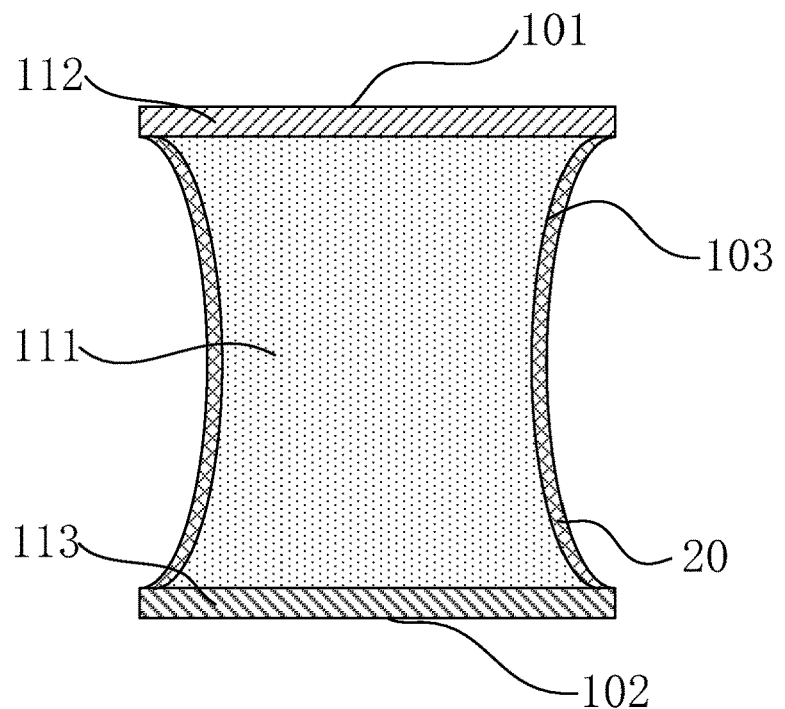
FIG. 4 is a structural diagram of another binding pad provided by a representative embodiment of the present disclosure.

In one representative embodiment of the present disclosure, the side surface 103 of the binding pad 10 includes a concave structure 1030. FIG. 3 is a structural diagram of a binding pad provided by an embodiment of the present disclosure, and FIG. 4 is a structural diagram of another binding pad provided by an embodiment of the present disclosure. In an embodiment, the concave structure 1030 included in the binding pad 10 is located on a side surface 103 between two adjacent binding pads 10, and an opening of the concave structure 1030 faces towards a binding pad 10 that is arranged in parallel and closest thereto. In an embodiment, the concave structure 1030 included in the binding pad 10 is located on the side surface 103 of the binding pad 10, and the concave structure 1030 on one of the binding pads 10 is continuous and not discrete. The first insulating layer 20 is disposed in the concave structure 1030, and in one representative embodiment, the first insulating layer 20 covers the concave structure 1030. Since the interior of the concave structure 1030 disposed on the side surface 103 of the binding pad 10 is provided with the first insulating layer 20, the first insulating layer 20 provides comprehensive protection to the binding pad 10 where the concave structure 1030 is located.

With continued reference to FIG. 3 and FIG. 4, in one representative embodiment of the present disclosure, the first insulating layer 20 overlaps neither the upper surface 101 nor the lower surface 102 of the binding pad 10. The upper surface 101 of the binding pad 10 does not need to be covered with a protective layer, and thus can be completely exposed, thereby ensuring a binding area of the binding pad 10. In other words, an effective binding area of the binding pad 10 is the area of the upper surface 101 of the binding pad 10, and the effective binding area of the binding pad 10 reaches a maximum value. Therefore, in a binding region, a spacing distance between the binding pads 10 is largest, which effectively ensures insulation between the binding pads 10. Or, a width of the binding area is significantly reduced while ensuring the insulation arrangement of the binding pads 10.

Further, the first insulating layer 20 is attached to the concave structure 1030, and there is no gap between the first insulating layer 20 and the concave structure 1030. Or, the first insulating layer 20 is attached with its entire surface to the side surface 103 of the binding pad 10, and there is no gap between the first insulating layer 20 and the side surface 103. Since the conductive structures in the display panel are mostly formed by wet etching the conductive film layers, absence of the gap between the first insulating layer 20 and the side surface 103 can effectively prevent the etching solution from coming into contact with the side surface 103.

With continued reference to FIG. 3 and FIG. 4, in one representative embodiment of the present disclosure, in a thickness direction of the display panel, the binding pad 10 includes a first conductive layer 112, a second conductive layer 111, and a third conductive layer 113, which are sequentially disposed, and the concave structure 1030 is formed on the second conductive layer 111, that is, the concave structure 1030 is provided on the second conductive layer 111 (e.g. only on the second conductive layer 111).

When the binding pad 10 adopts such a composite conductive layer, since different conductive layers have different etching rates in the same etching solution, conductive layers having low etching rates can be selected as the upper surface and the lower surface as needed. In addition, in order to ensure the conductivity of the binding pad 10, generally, the material of the second conductive layer is relatively fixed. Therefore, the concave structure 1030 can be fabricated on the second conductive layer 111 (e.g., only on the second conductive layer 111), and then the first insulating layer 20 is attached onto the concave structure 1030 while ensuring that there is no gap between the first insulating layer 20 and the concave structure 1030, so as to effectively protect the binding pad 10. Without doubt, fabricating the concave structure 1030 on the side surface 103 means forming the concave structure 1030 on side surfaces of the first conductive layer 112, the second conductive layer 111 and the third conductive layer 113, which is also within the protection scope of the present disclosure.

Figure 5:
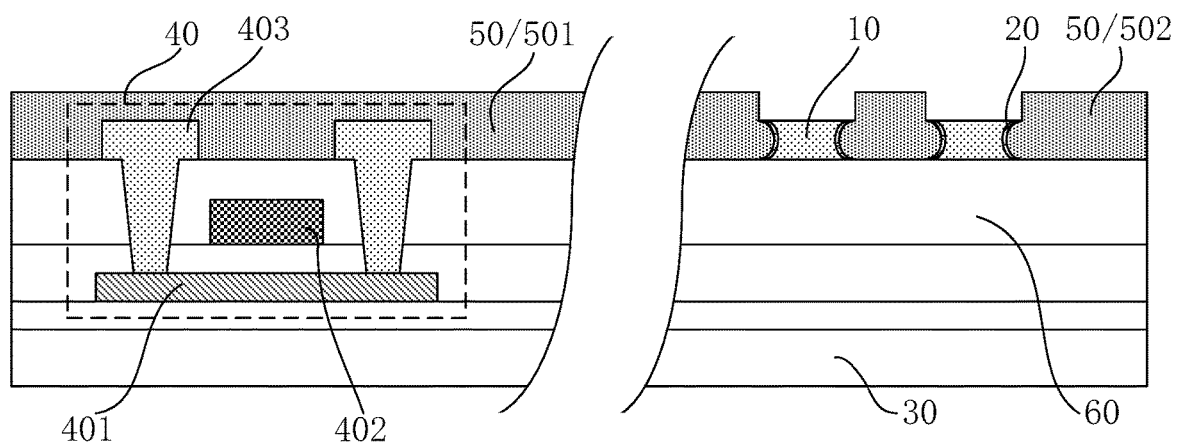
FIG. 5 is a partial cross-sectional diagram of a display panel provided by a representative embodiment of the present disclosure.

FIG. 5 is a partial cross-sectional diagram of a display panel provided by an embodiment of the present disclosure. Further, a plurality of transistors 40 is disposed on the substrate 30. Each transistor 40 includes a semiconductor structure 401, a gate electrode 402, and a source/drain electrode 403; and in an embodiment, the binding pad 10 is disposed in the same layer as the source/drain electrode 403. Generally, the source/drain electrode 403 is a three-layer composite conductive structure of Ti/Al/Ti, so the first conductive layer 112 of the binding pad is a Ti layer, the second conductive layer 111 is an Al layer, and the third conductive layer 113 is also a Ti layer. In an embodiment, the binding pad 10 can also be disposed in the same layer as the gate electrode 402. Since the binding pad 10 can be obtained in the same fabricating process as other conductive structures on the substrate 30, the fabricating process of the display panel can be simplified. Taking a case where the binding pad 10 and the source/drain electrode 403 are arranged in the same layer as an example, i.e., the binding pad 10 is the same three-layer composite conductive structure of Ti/Al/Ti as the source/drain electrode 403, since most of the existing display panels are built-in touch display panels, the touch trace is fabricated subsequent to the source/drain electrode 403 and the binding pad 10, and the touch trace is usually a three-layer composite conductive structure of Mo/Al/Mo; since both the binding pad 10 and the touch trace contain Al, there is a risk of damaging the binding pad 10 during the formation of the touch trace through wet etching, but forming the concave structure 1030 on the second conductive layer 111 of the binding pad 10 and providing the first insulating layer 20 in the concave structure 1030 can avoid the risk, thereby ensuring the conductivity property of the binding pad 10. It should be noted that, in FIG. 5, a film layer relationship between the binding pad 10 and the transistor 40 is exemplarily shown, and the specific film layer structure of the binding pad 10 and the specific film layer structure of the transistor 40 are not defined.

Further, with continued reference to FIG. 5, a planarization layer 50 is provided on the substrate 30, and the planarization layer 50 is disposed on the film layer where the source/drain electrode 403 and the binding pad 10 are located. The planarization layer 50 includes a first planarization layer 501 and a second planarization layer 502, and the first planarization layer 501 covers at least part of the plurality of transistors 40; and the first insulating layer 20 is disposed between the side surface 103 of the binding pad 10 and the second planarization layer 502. Since the binding pad 10 needs to be exposed, it is necessary to etch the planarization layer 50 on the binding pad 10. However, the planarization layer 50 is generally made of an organic material in order to achieve a better planarization effect, and since the first insulating layer 20 is made of an inorganic material, such as SiO$_2$, the etching mechanisms or the etching materials of the planarization layer 50 and the first insulating layer 20 are different, so that the first insulating layer 20 will not be damaged during the etching of the planarization layer 50.

Further, the first insulating layer 20 is formed by the atomic layer deposition technology and has a uniform thickness. Self-limiting and complementary nature of the atomic layer deposition allows that such technology has excellent control on the composition and the thickness of the film and the prepared film has good shape retention and uniformity, so that when forming the first insulating layer 20 on the side surface 103 of the binding pad 10, the thickness of the first insulating layer 20 can be ensured to be uniform by using this technology, thereby ensuring that the thickness of the binding region is uniform, and a binding yield will not be affected even if the first insulating layer 20 is formed on the binding pad 10. It should be noted that the material of the first insulating layer 20 may be the same as the material of other inorganic insulating layers on the substrate 30. For example, a second insulating layer 60 is present between the gate electrode 402 and the source/drain electrode 403, and the second insulating layer 60 is made of an inorganic material, so the first insulating layer 20 can be made of the same material as the second insulating layer 60 to save the cost.

In an embodiment of the present disclosure, a fabricating method of the display panel described in any of the above embodiments is provided, and the fabricating method includes following steps.

Figure 6:
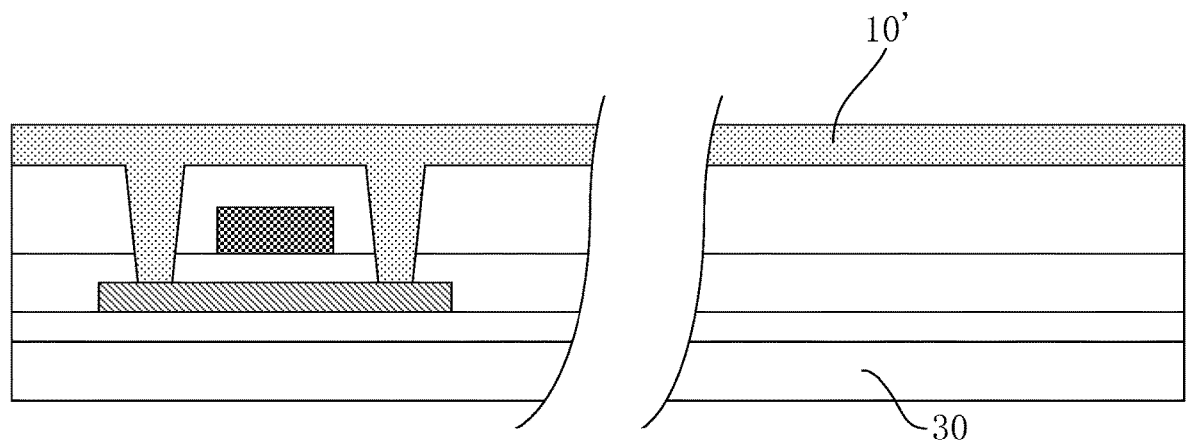
FIGS. 6-12 schematically illustrate fabricating methods of a display panel provided by representative embodiments of the present disclosure.
Figure 7:
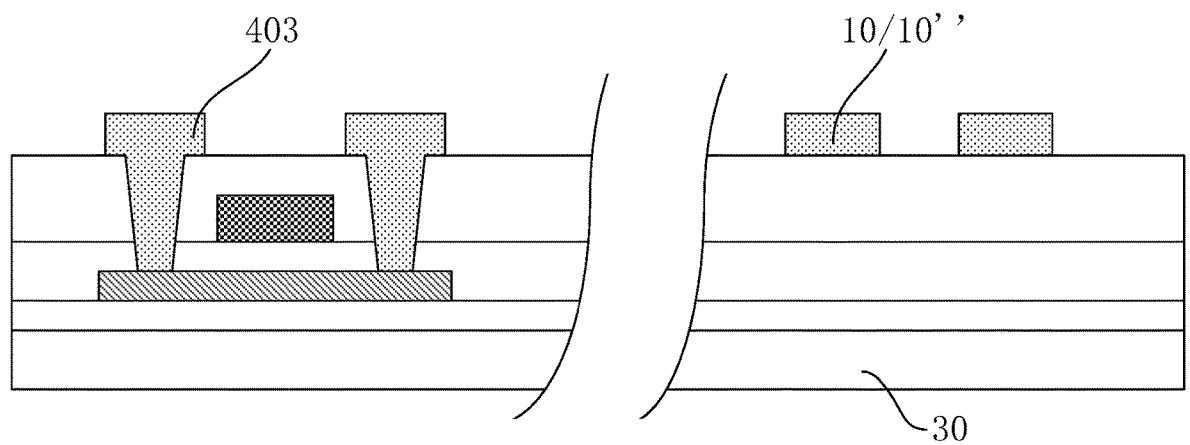
Figure 8:
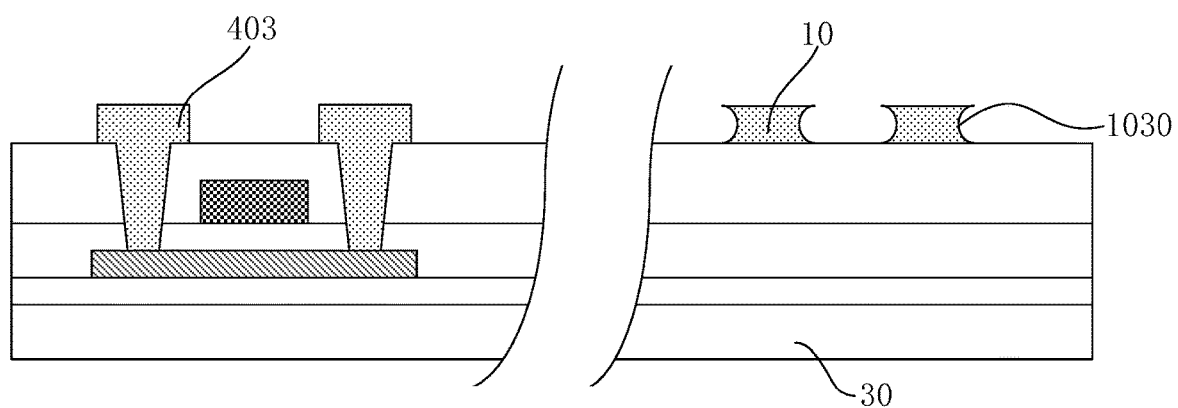

A first step: forming a plurality of mutually insulated binding pads 10 on the substrate 30. Referring to FIGS. 6-8, a continuous binding pad layer 10' is formed on the substrate 30, then the binding pad layer 10' is exposed and developed, and finally the exposed and developed binding pad layer 10' is etched to form a plurality of mutually insulated binding pads 10. It should be noted that the binding pads 10 can be disposed in the same layer as the source/drain electrode 403, so that both of them can be prepared in the same process, thereby saving the fabrication procedures.

In an embodiment, with continued reference to FIGS. 6-8, etching the exposed and developed binding pad layer to form the plurality of mutually insulated binding pads may further include: etching the exposed and developed binding pad layer 10' using a first etching solution to form a plurality of mutually insulated primary binding pads 10", and then etching the primary binding pads 10" using a second etching solution to form the binding pads 10 of which the side surface 103 includes the concave structure 1030. Etching rates of the first etching solution and the second etching solution on a constituent material of the binding pad 10 are different. For example, in the thickness direction of the display panel, the binding pad 10 includes a first conductive layer 112, a second conductive layer 111, and a third conductive layer 113 that are disposed in sequence, and by taking advantages of the different etching rates of the same etching solution on the different conductive layers, the concave structure 1030 can be formed on the second conductive layer 111, i.e., the concave structure 1030 is provided on the second conductive layer 111 (e.g., only on the second conductive layer 111).

Each binding pad 10 includes an upper surface, a lower surface, and a side surface. The upper surface and the lower surface are both parallel to a plane of the substrate 30, the upper surface is a surface facing away from the substrate 30, and the lower surface is a surface close to the substrate 30. The side surface is located between the upper surface and the lower surface, and the side surface connects the upper surface with the lower surface.

A second step: forming a first insulating layer 20 on the side surface 103 of the binding pad 10. The first insulating layer 20 is in contact with the side surface of the binding pad 10, and the first insulating layer is made of an inorganic material.

Figure 9:
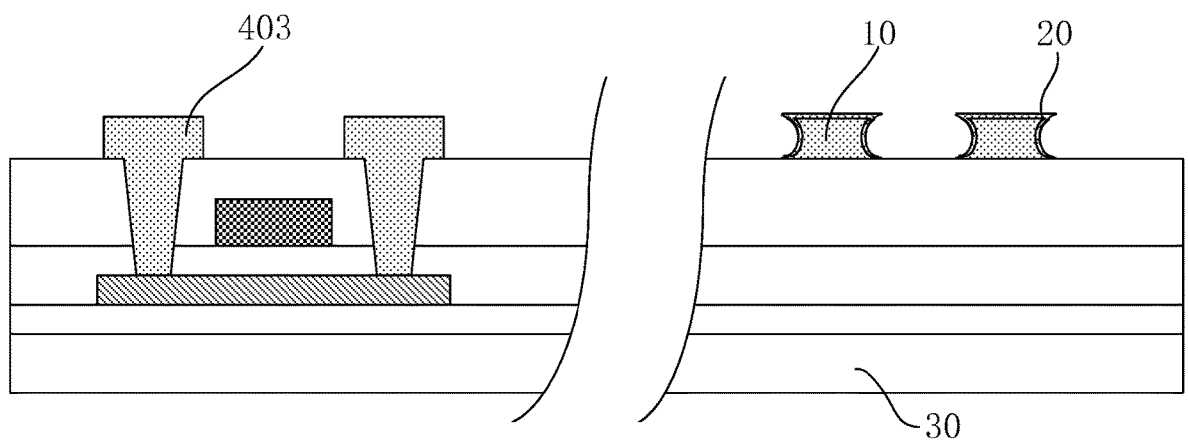
Figure 10:
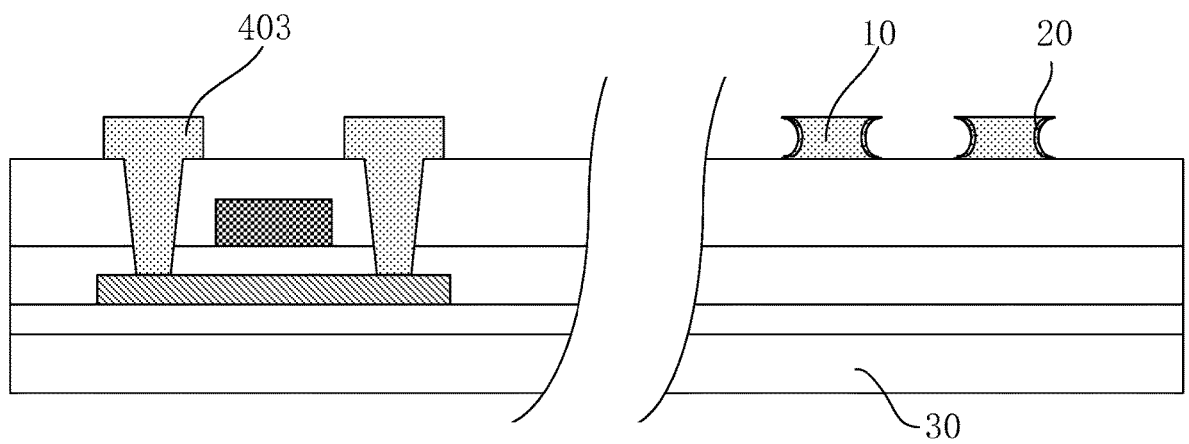

In an embodiment, referring to FIG. 9 and FIG. 10, an atomic layer deposition technology is adopted to form the first insulating layer 20 on the upper surface 101 and the side surface 102 of the binding pad 10, and the first insulating layer 20 formed on the upper surface 101 is removed by an etching technology. In an embodiment, the first insulating layer 20 is formed in the concave structure 1030 provided on the side surface of the binding pad 10.

In an embodiment, simply referring to FIG. 10, the upper surface of the binding pad 10 is shaded, and the atomic layer deposition technology is adopted to form the first insulating layer 20 on the side surface 102 of the binding pad 10. In an embodiment, the first insulating layer 20 is formed in the concave structure 1030 provided on the side surface of the binding pad 10. Self-limiting and complementary nature of the atomic layer deposition allows that such technology has excellent control on the composition and the thickness of the film and the prepared film has good shape retention and uniformity, so that when forming the first insulating layer 20 on the side surface 103 of the binding pad 10, the thickness of the first insulating layer 20 can be ensured to be uniform by using this technology, thereby ensuring that the thickness of the binding region is uniform, and a binding yield will not be affected even if the first insulating layer 20 is formed on the binding pad 10.

Since the interior of the concave structure 1030 disposed on the side surface 103 of the binding pad 10 is provided with the first insulating layer 20, the first insulating layer 20 can provide comprehensive protection to the binding pad 10 where the concave structure 1030 is located.

Figure 11:
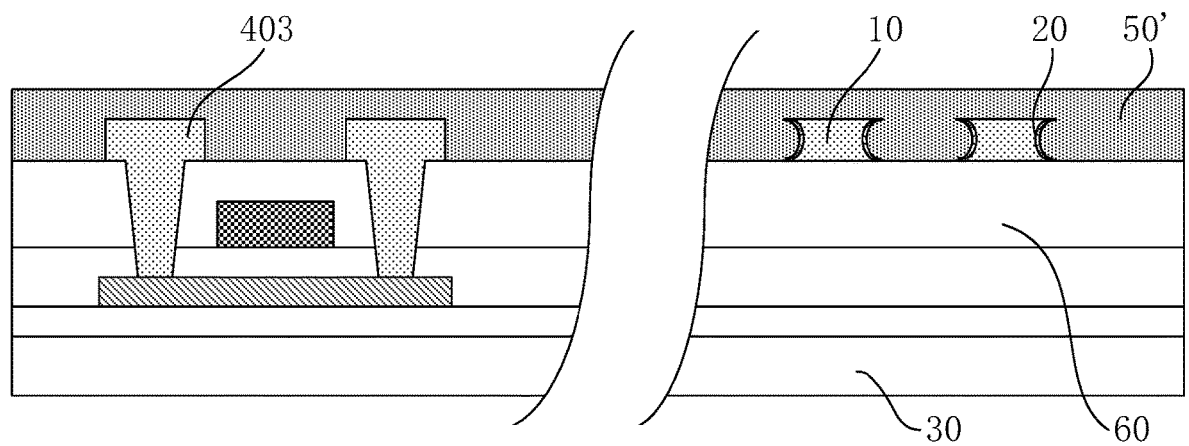
Figure 12:
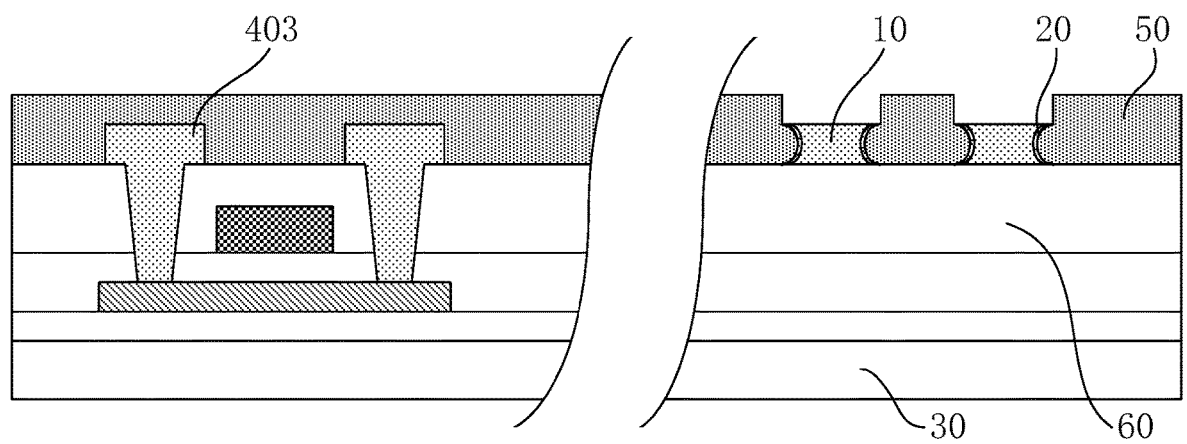

In an embodiment, the fabricating method further includes a third step: fabricating a planarization layer on the binding pad 10, and completely exposing the binding pad 10. Referring to FIG. 11 and FIG. 12, first, a primary planarization layer 50' is formed on the film layer where the binding pad 10 is located, and the primary planarization layer 50' completely covers the binding pad 10. Then, the primary planarization layer 50' on the binding pad 10 is completely removed by etching to form the planarization layer 50, that is, to completely expose the binding pad 10. That is, the first insulating layer 20 overlaps neither the upper surface 101 nor the lower surface 102 of the binding pad 10. The upper surface 101 of the binding pad 10 does not need to be covered with a protective layer and thus can be completely exposed, thereby ensuring a binding area of the binding pad 10. In other words, an effective binding area of the binding pad 10 is the area of the upper surface 101 of the binding pad, so that the effective binding area of the binding pad 10 reaches a maximum value. Therefore, in a certain binding region, a spacing distance between the binding pads 10 is largest, which effectively ensures insulation between the binding pads 10. Or, a width of the binding region is significantly reduced while ensuring insulation arrangement of the binding pads 10.

Related embodiments of the fabricating method of the present disclosure provide an implementation manner in which the first insulating layer is provided on the side surface of the binding pad in the display panel, and the binding pad 10 in the display panel fabricated by this method is protected by the first insulating layer 20, and the side surface will not be damaged by subsequent etching processes. In the embodiments of the present disclosure, since the side surface of the binding pad has the concave structure, the first insulating layer that plays a protection role does not need to be in contact with the upper surface of the binding pad, thereby increasing an effective area of the binding pad. Moreover, adopting the atomic deposition technology can achieve seamless contact between the first insulating layer and the side surface, thereby completely blocking contact between the etching solution and the portion of the binding pad that needs to be protected.

The above are representative embodiments of the present disclosure and are not intended to limit the present disclosure. Any modifications, equivalents, improvements, etc., which are made within the principles of the present disclosure, should be included in the protection scope of the present disclosure.

What is claimed is:

1. A display panel, comprising:
a substrate;
a plurality of mutually insulated binding pads disposed on the substrate, wherein each binding pad of the plurality of mutually insulated binding pads comprises an upper surface, a lower surface and a side surface, the upper surface and the lower surface are both parallel to a plane of the substrate, the side surface is located between the upper surface and the lower surface, and the side surface connects the upper surface with the lower surface; and
a first insulating layer disposed on the side surface, wherein the first insulating layer is in contact with the side surface of the binding pad, and the first insulating layer is made of an inorganic material,
wherein the side surface comprises a concave structure, and the first insulating layer is disposed within the concave structure, wherein an opening of the concave structure faces towards a binding pad of the plurality of mutually insulated binding pads that is closest thereto, and wherein the concave structure on each binding pad is continuous and not discrete.

2. The display panel according to claim 1, wherein each binding pad comprises a first conductive layer, a second conductive layer, and a third conductive layer that are disposed sequentially in a thickness direction of the display panel; and the concave structure is formed on the second conductive layer, wherein the first insulating layer is attached to the concave structure, and no gap is present between the first insulating layer and the concave structure.

3. The display panel according to claim 1, wherein the first insulating layer is attached with its entire surface to the side surface, and no gap is present between the first insulating layer and the side surface.

4. The display panel according to claim 1, further comprising a plurality of transistors disposed on the substrate, wherein each transistor of the plurality of transistors comprises a semiconductor structure, a gate electrode, and a source/drain electrode; and the plurality of mutually insulated binding pads is disposed in a same layer as the source/drain electrode.

5. The display panel according to claim 4, further comprising a planarization layer disposed on the substrate, the planarization layer being made of an organic material;
wherein the planarization layer comprises a first planarization layer and a second planarization layer, the first planarization layer covers at least part of the plurality of transistors, and the first insulating layer is disposed between the side surface and the second planarization layer.

6. The display panel according to claim 1, wherein the first insulating layer has a uniform thickness; and the first insulating layer is formed using an atomic layer deposition technology.

7. The display panel according to claim 1, wherein the first insulating layer overlaps neither the upper surface nor the lower surface.

8. A fabricating method of a display panel, comprising:
forming a continuous binding pad layer on a substrate, exposing and developing the continuous binding pad layer, etching the continuous binding pad layer with a first etching solution at a first etching rate to form a plurality of mutually insulated primary binding pads after exposing and developing the continuous binding pad layer, and etching the plurality of mutually insulated primary binding pads with a second etching solution at a second etching rate to form a plurality of mutually insulated binding pads, wherein the first etching rate is different from the second etching rate, wherein each binding pad comprises an upper surface, a lower surface and a side surface, wherein the upper surface and the lower surface are both parallel to a plane of the substrate, the side surface comprises a concave structure and is located between the upper surface and the lower surface, and the side surface connects the upper surface with the lower surface; and
forming a first insulating layer on the side surface, the first insulating layer being in contact with the side surface, and the first insulating layer being made of an inorganic material.

9. The fabricating method according to claim 8, wherein said forming the first insulating layer on the side surface comprises forming the first insulating layer within the concave structure.

10. The fabricating method according to claim 8, wherein said forming the first insulating layer on the side surface comprises forming the first insulating layer on the side surface of the binding pad using an atomic layer deposition technology.

11. The fabricating method according to claim 10, wherein said forming the first insulating layer on the side surface using the atomic layer deposition technology comprises:
forming the first insulating layer on the upper surface and the side surface using the atomic layer deposition technology, and removing the first insulating layer formed on the upper surface using an etching technology.

* * * * *